United States Patent
Iotov et al.

(10) Patent No.: US 7,634,752 B2
(45) Date of Patent: *Dec. 15, 2009

(54) SYSTEM AND METHOD FOR DESIGN ENTRY AND SYNTHESIS IN PROGRAMMABLE LOGIC DEVICES

(75) Inventors: Mikhail Iotov, San Jose, CA (US); Greg Starr, San Jose, CA (US)

(73) Assignee: Altera Corporation, San Jose, CA (US)

( * ) Notice: Subject to any disclaimer, the term of this patent is extended or adjusted under 35 U.S.C. 154(b) by 103 days.

This patent is subject to a terminal disclaimer.

(21) Appl. No.: 11/592,734

(22) Filed: Nov. 3, 2006

(65) Prior Publication Data

US 2007/0261014 A1    Nov. 8, 2007

Related U.S. Application Data

(63) Continuation of application No. 10/353,816, filed on Jan. 28, 2003, now Pat. No. 7,159,204.

(51) Int. Cl.
*G06F 17/50* (2006.01)

(52) U.S. Cl. .............................. 716/16; 716/17; 716/18; 703/21

(58) Field of Classification Search .............. 716/16–18; 703/21
See application file for complete search history.

(56) References Cited

U.S. PATENT DOCUMENTS

| 6,219,628 | B1 * | 4/2001 | Kodosky et al. | 703/2 |
| 6,272,669 | B1 * | 8/2001 | Anderson et al. | 716/16 |
| 6,324,672 | B1 * | 11/2001 | Lawman et al. | 716/1 |
| 6,704,908 | B1 * | 3/2004 | Horan et al. | 716/1 |
| 6,971,066 | B2 * | 11/2005 | Schultz et al. | 715/771 |
| 7,024,654 | B2 * | 4/2006 | Bersch et al. | 716/16 |
| 7,024,660 | B2 * | 4/2006 | Andrade et al. | 717/124 |
| 7,159,204 | B2 * | 1/2007 | Iotov et al. | 716/16 |

* cited by examiner

*Primary Examiner*—Naum B Levin
(74) *Attorney, Agent, or Firm*—Townsend and Townsend and Crew LLP

(57) ABSTRACT

A system and method facilitates the implementation of analog circuitry in electronic programmable devices. A user can specify user measurable parameters for analog features of the circuit, without requiring knowledge of the internal way in which those analog circuit are implemented in the programmable device to achieve desired properties of the analog parameters of interest. The implementation can be performed in different devices which may implement the analog circuit in vastly different ways.

20 Claims, 9 Drawing Sheets

SYSTEM AND METHOD FOR DESIGN ENTRY AND SYNTHESIS IN PROGRAMMABLE LOGIC DEVICES

CROSS-REFERENCES TO RELATED APPLICATIONS

The present application is a Continuation Application of U.S. application Ser. No. 10/353,816, filed Jan. 28, 2003, now U.S. Pat. No. 7,159,204.

BACKGROUND OF THE INVENTION

The present invention relates generally to integrated circuits and more specifically to programming integrated circuits having programmable logic and programmable analog elements.

Design engineers, faced with the challenge of designing increasingly high performance systems, often turn to programmable logic devices (PLDs) which combine logic and analog elements on the same chip. Conventional design systems for PLDs enhanced with programmable analog elements can provide support for analog circuits commonly used in conjunction with logic. For example, a user can easily configure a simple PLL or DLL circuit to achieve a desired division or multiplication, as it involves a relatively trivial computation.

However, as systems become more sophisticated, increasingly complex analog circuitry is required. The parameters for specifying these circuits are no longer a trivial matter in some cases. Consider a complex phase locked loop (PLL) analog circuit (e.g. one with two or more clock outputs and programmable loop elements). One cannot simply enter a set of parameters specifying the reconfigurable hardware elements to implement a PLL in a programmable device and expect suitable (e.g., stable) operation of the circuit. A number of stability relationships typically need to be satisfied. For example, in the Stratix PLLs, the shape of the transfer curve in frequency space must have a particular form. Special attention must be given to the 'zero', 'pole', and bandwidth values, which need to satisfy certain conditions, such as:

$$F_{zero}=1/(2*Pi*R*C); Pi=3.14$$

$$F_{pole}=1/(2*Pi*R*C_h);$$

$$Bandwidth=I*R*K_{vco}/(M*2*Pi);\text{ and}$$

$$F_{zero}<Bandwidth<F_{pole}.$$

These conditions are difficult to achieve with manual selection of the M, R, S, C, and $C_h$ values.

It can be appreciated therefore, that manual computation of the reconfigurable hardware elements to attain a desired circuit behavior is a very difficult (if not impossible) and a highly time intensive task, absent a detailed knowledge of circuit theory and access to an implementation of the computational algorithms. Typically, the designer knows what she wants from an analog circuit in terms of its high level, observable behavior; e.g., a certain frequency response. However, a properly configured programmable device which implements the desired analog circuit oftentimes requires a greater understanding in circuit theory than may be possessed by a system-level designer.

There is a desire to facilitate the design process of programmable devices which incorporate programmable logic and programmable analog elements. There is a need to allow designers to specify analog circuit behavior in a programmable device without requiring the intimate knowledge of circuit theory that may be needed to attain a workable implementation.

SUMMARY OF THE INVENTION

An aspect of the invention provides HDL design entry of analog properties of an analog circuit rather than conventional hardware properties of the programmable analog elements used to implement the analog circuit. In accordance with embodiments of the invention, a user interface and synthesis algorithm are provided for specifying analog features of an analog circuit to facilitate programming programmable logic and programmable analog elements comprising an electronic device. A computation engine computes appropriate hardware settings for the programmable hardware elements to meet user requirements, subject to hardware constraints imposed by the particular device.

According to the invention, the programmable device can be a programmable logic device comprising programmable logic and programmable analog elements. More generally, the programmable device can be any electronic device having programmable logic and programmable analog elements.

The present invention allows the user to specify properties for analog circuits without any knowledge of the internal implementation details by which such circuits might be implemented in a particular programmable device. In fact, among different programmable devices the implementation can be vastly different for each device and the user would not know it.

BRIEF DESCRIPTION OF THE DRAWINGS

The present invention can be understood with reference to the following description and the accompanying figures, where.

DETAILED DESCRIPTION

Certain terms are defined herein for the purposes of the following discussion, since their ordinary meanings tend to vary in the literature. The phrase "analog parameter" refers to an observable characteristic of an analog circuit (e.g., frequency response measured in terms of its bandwidth). The phrase "analog properties" refers to the user-desired observable quantities that characterize a circuit (e.g., bandwidth, lock-time, etc.). The phrase "programmable analog elements" refers to the basic hardware devices, some parameters of which can be programmed, e.g. capacitance, resistance, charge pump current, and so on. The phrase "hardware parameter" refers to a programmable aspect of the programmable analog elements that can be set; e.g. suppose the programmable analog element is a resistor, a programmable aspect of the resistor would be its resistance. The phrase "hardware property" refers to a value (setting) applied to a programmable analog element; e.g. the resistance value.

Figure 1:
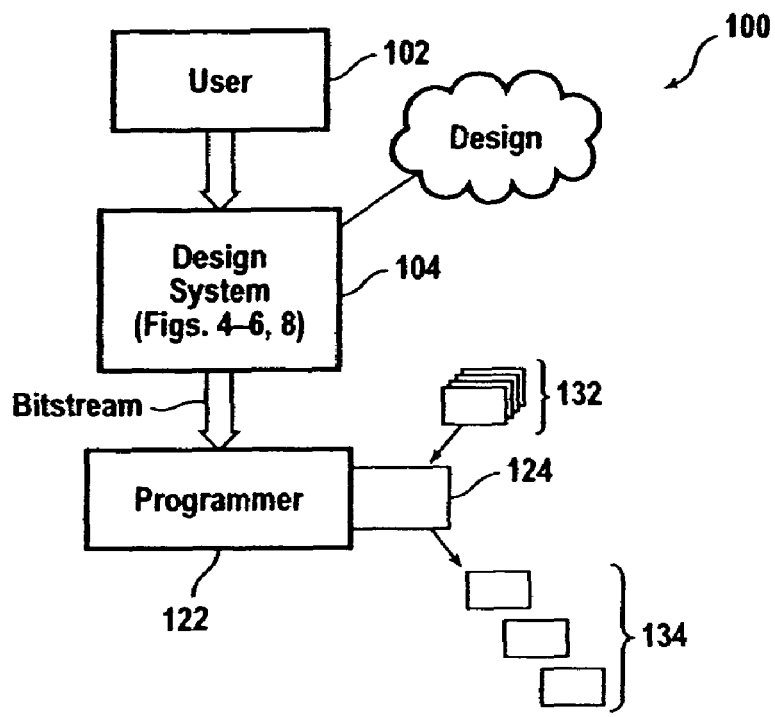
FIG. 1 shows a high level generalized system block diagram of an illustrative embodiment of the present invention.

As can be seen in the system exemplar of FIG. 1, an illustrative embodiment of a design system 100 for programmable logic in accordance with the present invention includes a design system component 104 as the principal component. The design system component receives directives from a user 102 resulting in a design to be implemented with programmable devices. For the discussion which follows, it can be appreciated that the term "programmable device" encompasses a wide variety of implementations, including but not limited to conventionally known devices such as PLD's (programmable logic devices), FPGA's (field programmable gate arrays), and the like. Programmable devices, however, can also refer to ASIC's (application specific integrated circuits) which feature some degree of programmability by incorporating various programmable elements. More generally, "programmable devices" will be understood to mean any electronic device having some degree of programmability by having incorporated therein programmable elements. Furthermore, it will be understood that in the context of the present invention, "programmable elements" includes programmable logic elements and programmable analog elements.

Continuing with FIG. 1, it can be appreciated that the "user" 102 can be a conventional human user. However, a "user" can be any source of information from which a design can result, such as a machine that is appropriately interfaced to the design system 100.

The design is conventionally specified in HDL (hardware definition language), which is a common specification language that predominates in this technical field. However, it is noted that a specification language paradigm (such as HDL) is not required to practice the invention. It can be appreciated that alternate hardware specification methodologies can be adapted to the present invention.

The design system component 104 can produce a bitstream which specifies the logic and analog elements in a programmable device to implement the desired design. The bitstream is generated from the HDL specification by a process known as "compiling" which is a very well known and understood operation. The bitstream is then provided to a programmer 122. As shown in FIG. 1, a suitable interface can be provided between the design system component 104 and the programmer to facilitate the transfer of information representative of the bitstream from the design system component to the programmer. The device programmer is a conventionally known apparatus used to program programmable devices 132 in accordance with the bitstream to produce programmed devices 134 that implement the design.

Figure 2:
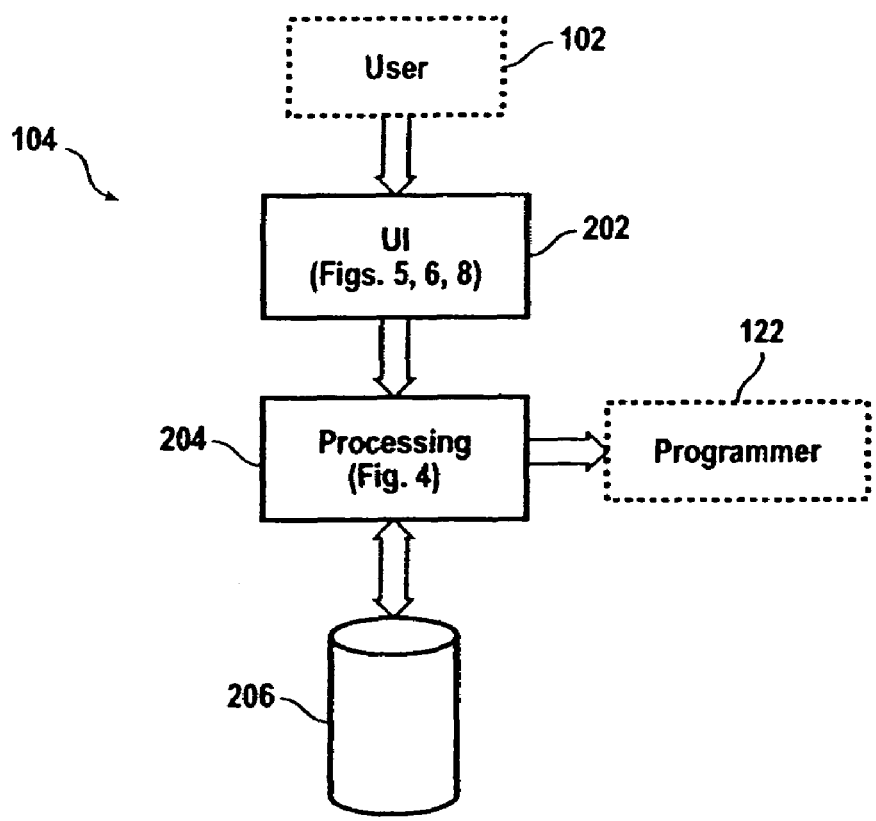
FIG. 2 shows a generalized block diagram of the design system component shown in FIG. 1.

FIG. 2 shows a highly generalized system block diagram of the design component 104 shown in FIG. 1. Typically, there is a processing component 204 which can provide various functions to facilitate the design process. The processing component can be any common computing system architecture, for example a PC (personal computer) or a workstation configured with appropriate input and output devices, and operating under an OS (operating system) such as Unix.

Typical phases of the design process include identifying system requirements for the programmable device, defining the system architecture, designing the logic which constitutes a high level design of the system, and implementation of the design. In the present invention the design includes analog circuitry in addition to conventional logic. For example, a commonly employed analog circuit is a phase-locked loop (PLL). For convenience, the remainder of the discussion will be based on the PLL as the analog design element and its analog properties. However, it can be appreciated that other programmable analog elements suitable for incorporation with programmable logic can be readily provided in accordance with the invention. The various aspects of the invention described in connection with PLL's can be readily extended and/or adapted for programmable analog elements which can be used to implement analog circuits other than PLL's.

Continuing with FIG. 2, an appropriate user interface (UI) 202 can be provided to access the processing component 204. Typical UI's include the familiar graphical user interface (GUI). However, a command line interface (CLI) can be provided. A CLI interface may be appropriate if the design is produced elsewhere, and the design system 100 is simply configured to serve as a compiler to produce the bitstream. The UI can be a machine interface, which might be appropriate in a configuration where the design system is incorporated in a larger design processing system. For example, a DSP builder system may use the same computational engine (408, FIG. 4) and interface with the processing component 204 via a suitable machine interface. It can be appreciated that the UI can manifest itself in any of a number of forms, depending on the circumstances or requirements of the operating environment.

A data storage component 206 can be provided to store a variety of information. For example, the data store can be used to store a generated bitstream for later downloading to the device programmer 122.

The foregoing components can be arranged in any of a number of configurations. A conventional arrangement is a standalone configuration in which all the components are provided in a single system such as the one shown in FIG. 2. In such a configuration, the processing component can be a workstation running an appropriate operating system. Appropriate software can be included to provide the various functions for performing the operations in accordance with the invention; e.g., the chart in FIG. 4 discussed below illustrates aspects of the present invention.

Figure 3A:
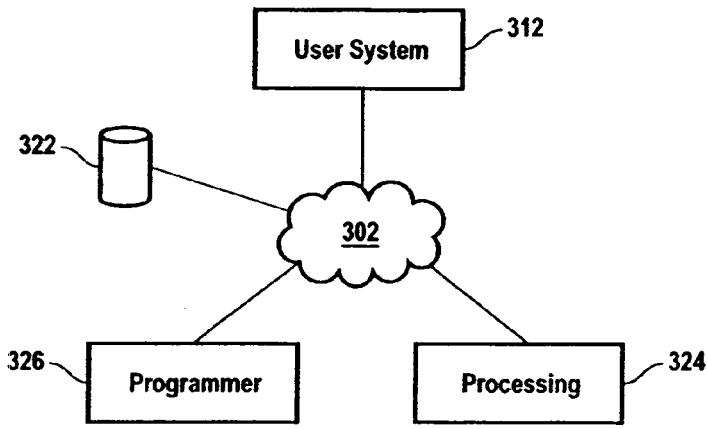
FIGS. 3A and 3B illustrate exemplars of typical networked configurations of the embodiment shown in FIG. 1.

FIG. 3A generically represents various configurations of the system shown in FIG. 1. For example, the user system 312 might comprise the components shown in FIGS. 1 and 2, absent the data store 206 (FIG. 2). In such a configuration, a remote data store 322 can be provided. An appropriate communication network 302 can be provided to facilitate communication between the user system and the remote data store. This configuration might be appropriate in a large enterprise, where users have diskless workstations.

FIG. 3A also represents a configuration in which the user system 312 comprises the components shown in FIGS. 1 and 2, except that some or all of the processing is provided remotely by the remote processing component 324, thus obviating the processing component 204 (FIG. 2). This may be suitable in an architecture, for example, where a single high-end, expensive, computer is shared among many users. In still another configuration, the device programmer 122 (FIG. 1) is separated from the user system 312, and replaced by a remote device programmer 326.

Figure 3B:
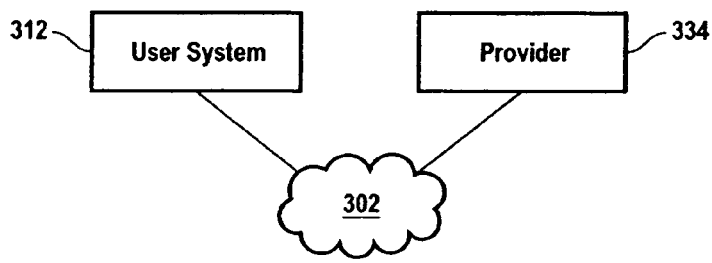

FIG. 3B shows a configuration where the processing aspects of the present invention can be provided remotely. Thus, a business model might include a provider 334 who provides access to certain processing functions over the Internet. In another business model, the provider might supply upgrades to the user system 312. Thus, one can appreciate from the foregoing examples that a variety of distributed processing configurations can be readily attained by those of ordinary skill in the relevant arts.

In accordance with the invention, a user is allowed to specify the analog properties of an analog circuit which can be implemented in electronic devices ("programmable devices") having programmable logic elements and programmable analog elements. As noted above, the remaining discussion will use phase-locked loop (PLL) circuits as an example of an analog circuit as a matter of convenience, it being understood that the invention is not limited to a PLL as the only analog circuit.

The user can specify user measurable properties for advanced (analog) features, without any knowledge of the internal way in which those features are implemented in the PLL. In fact, for a different programmable device which provides different programmable analog elements, the analog circuit might be implemented in a vastly different way.

Figure 4:
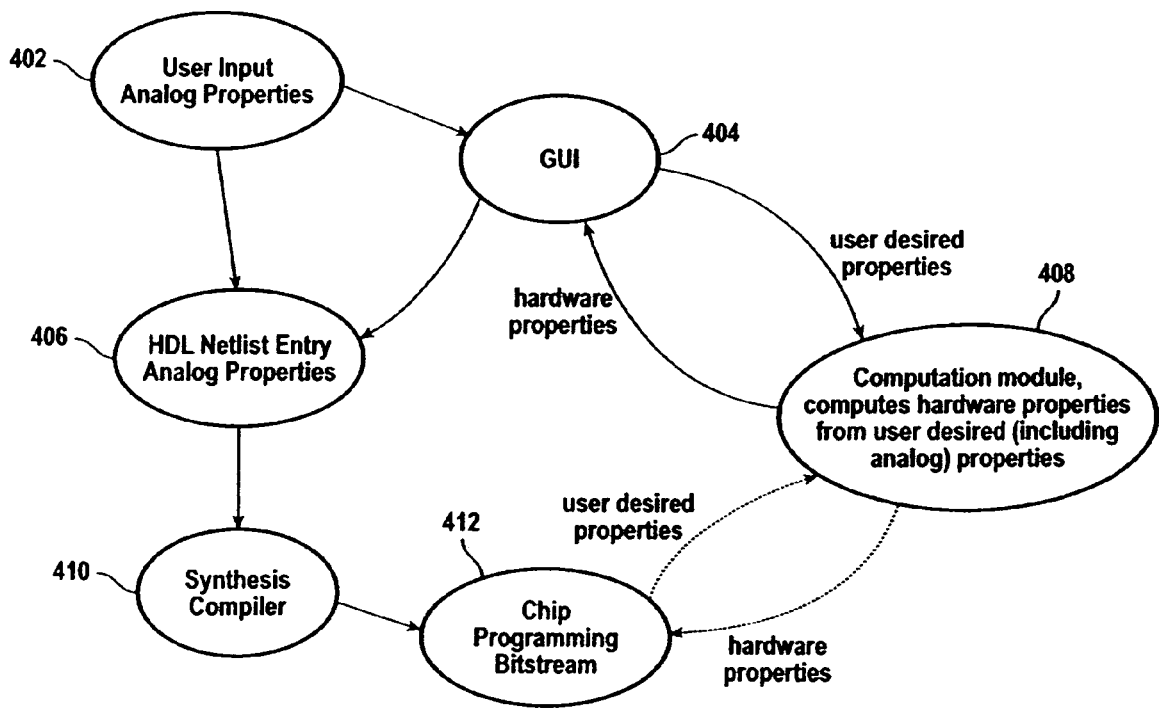
FIG. 4 shows the high level functional components of a design system in accordance with the invention.

FIG. 4 is a high level illustration of the functional units and relevant data components comprising a design system according to the present invention. The functional units represent actions performed on data by a user or a computing system. Accordingly, in the case of a computing system, the functional units can be computer program code or the like to perform the indicated function.

A user input functional unit 402 represents a source of data for a design. For example, the input can be an identifier that specifies a file containing the design. In the case of a human user, the input can be a file specifier. Alternatively, the input can be the design itself, the design being provided by the user via a user interface functional unit 404. The figure shows a GUI (graphical user interface) as an example of a user interface functional unit. Typically, a GUI-type interface is an appropriate user interface for specifying a design from scratch, or to modify an existing design. It can be appreciated of course that a simple command line interface may suffice for certain applications, wherein the user is provided with a set of commands that she types. It can be further appreciated that the user input can be a machine-to-machine interface. This might be appropriate in a configuration which places the user interface on one machine while the data processing components are on another machine(s) accessed over a suitable communication channel and communicating via a suitable communication protocol(s). FIGS. 3A and 3B show examples of possible configurations.

A netlist specification 406 is the data component that can result from the interaction between the user input functional unit 402 and the user interface functional unit 404. Alternatively, the user can provide the design specification directly to the system, as indicated by the flow from the user input functional unit 402 directly to the netlist specification 406. For example, a predefined HDL (netlist) specification may be read from a floppy disk, or some such storage medium, or it can be provided over a communication network, such as a LAN, WAN, or even the Internet As will be explained below, the netlist specification can include information representative of user-specified analog properties that characterize an analog circuit.

The user interface functional unit 404 can communicate with a computational unit 408. As will be discussed in more detail, the computational unit generates information representative of hardware properties (values, settings) for a specific implementation of the programmable analog elements in the programmable device. This information can be processed by the GUI to provide a useful display to the user, thus allowing the user to modify the design or simply to verify a design. As will be discussed below, the GUI is a suitable interface for allowing the user to perform "what if" experiments with the design.

At some point, a decision will be made to proceed to the next phase of the design cycle, namely, to program a device. In the case of a user interacting with the user interface functionality 404, a directive can be issued to the GUI to generate the HDL specification 406. As noted above, the HDL specification can be provided directly from the user input functionality 402 as an alternate data path.

The HDL specification 406 is then provided to a synthesis functional unit 410. A conventional synthesis compiler receives an HDL specification and produces a data component known as a "bitstream." This bitstream specifies the "programming" of a programmable device to implement the design which is represented by the HDL specification. An embodiment in accordance with an aspect of the invention includes extending the HDL specification language definition to provide analog element primitives (language constructs) which represent user defined analog parameters that define the analog properties of the analog circuit. As mentioned above, the term "analog properties" refers to the user desired observable quantities that characterize a circuit (e.g. bandwidth, lock-time, etc.).

Providing additional HDL language elements allows a circuit designer to specify the characteristics of an analog circuit at a level of abstraction that is more familiar to the designer. Conventional HDL's such as Verilog®, VHDL, AHDL, and the like can be readily extended in accordance with the invention to permit a user to design analog circuits by specifying behavioral properties of the analog circuit.

The synthesis functional unit 410 provides conventional synthesis compiling functionality, along with the ability to compile the HDL language extensions. The synthesis functional unit can communicate with the computational functional unit 408 to obtain hardware properties of the programmable analog elements based on the analog properties of the analog circuit (e.g., PLL) as specified in the HDL specification. As defined above, the hardware properties are the settings of the programmable analog element that will implement the desired analog circuit.

In the case of a PLL analog circuit, settings associated with the programmable analog elements can include a charge pump current setting, a high frequency loop capacitor setting, a loop resistor setting, and a VCO gain setting. Based on the foregoing, it can be appreciated that other analog circuits will comprise corresponding programmable analog elements.

The result of the synthesis operation is a bitstream data component 412 which comprises bitstream patterns for programming the programmable logic elements in a programmable device and bitstream patterns (representative of settings) for programming the programmable analog elements contained in the programmable device. The programming results in an implementation of an analog circuit (e.g., a PLL) having the operating properties (characteristics) specified in the HDL specification.

An aspect of the invention is a method for design entry of analog properties. A more general embodiment of this aspect of the invention therefore is the user interface. The user interface functionality 404 represents a suitable user interface for requesting specific analog properties of an analog circuit. It is not relevant to the present invention how the user-specified analog properties are mapped to the hardware settings of the programmable analog elements. However, HDL is a widely used method for performing such a mapping to program a programmable device. Therefore, in a particular embodiment of the invention, the HDL language can be extended, as discussed above, to provide for this aspect of the invention.

To illustrate, consider our example analog circuit, the PLL. A commonly specified property (characteristic) of a PLL is the bandwidth parameter. A PLL's bandwidth is a measure of its ability to track the input clock and jitter. A high-bandwidth PLL can quickly lock onto a reference clock and thus can quickly react to any changes in the clock. However, the circuit becomes susceptible to jitter due to fluctuations in the clock. A low-bandwidth PLL, on the other hand, will take longer to lock, but will filter more jitter. Allowing a user to directly specify the bandwidth parameter offers great flexibility in compensating for jitter when an application requires cascading PLL's. Providing a configurable bandwidth parameter allows PLL designs be readily adapted in a wide variety of applications.

Another analog property associated with PLL's is the spread spectrum parameter. Spread spectrum is a method for reducing EMI (electromagnetic interference) by varying the clock frequency in a controlled manner. Varying the frequency reduces the total energy at any particular frequency because the clock does not run at any one frequency for a significant length of time. This results in a "smearing out" of the energy over a range of frequencies. A common numerical representation for specifying the spread spectrum parameter is the percent deviation of the frequency from its nominal value during normal operation. The spectral spreading of the clock signal is an approach to distribute the energy of the fundamental clock frequency to minimize peaking the energy at specific frequencies. The modulation width can be measured in up, down or center spread percentage. The "spread percentage" is typically defined as:

$(f_{max} - f_{min})/f_{max}$.

Modulation frequency is a property of PLLs, used in conjunction with the spread spectrum and which refers to the frequency at which the nominal frequency oscillates about the nominal value.

Duty cycle is a property of PLL's which refers to the ratio of the output high time to the total cycle time, expressed as a percentage.

Another parameter that describes a property of a PLL is the lock time. This parameter refers to the amount of time that is required by the PLL to attain the target frequency and phase after power-up, or after a programmed output frequency change.

Frequency overshoot is a parameter which specifies the maximum value, as a percentage of the operating frequency, above the nominal working frequency that the PLL will exhibit. For example, if the nominal frequency is $f_n$ and the PLL can reach a maximum value of $f_{max}$, then the overshoot parameter is $(f_{max}/f_n)-1$. Frequency overshoot can occur during a transient clock switchover event.

Attenuation factor is a parameter which indicates how much the PLL attenuates jitter on the reference clock. Basically, if the reference jitter is at a lower frequency than the PLL bandwidth, then the PLL will exactly track the reference jitter. If the frequency is greater than the PLL bandwidth, then the PLL will reject the jitter (attenuate it). The degree of attenuation is a function of the PLL architecture.

Figure 5A:
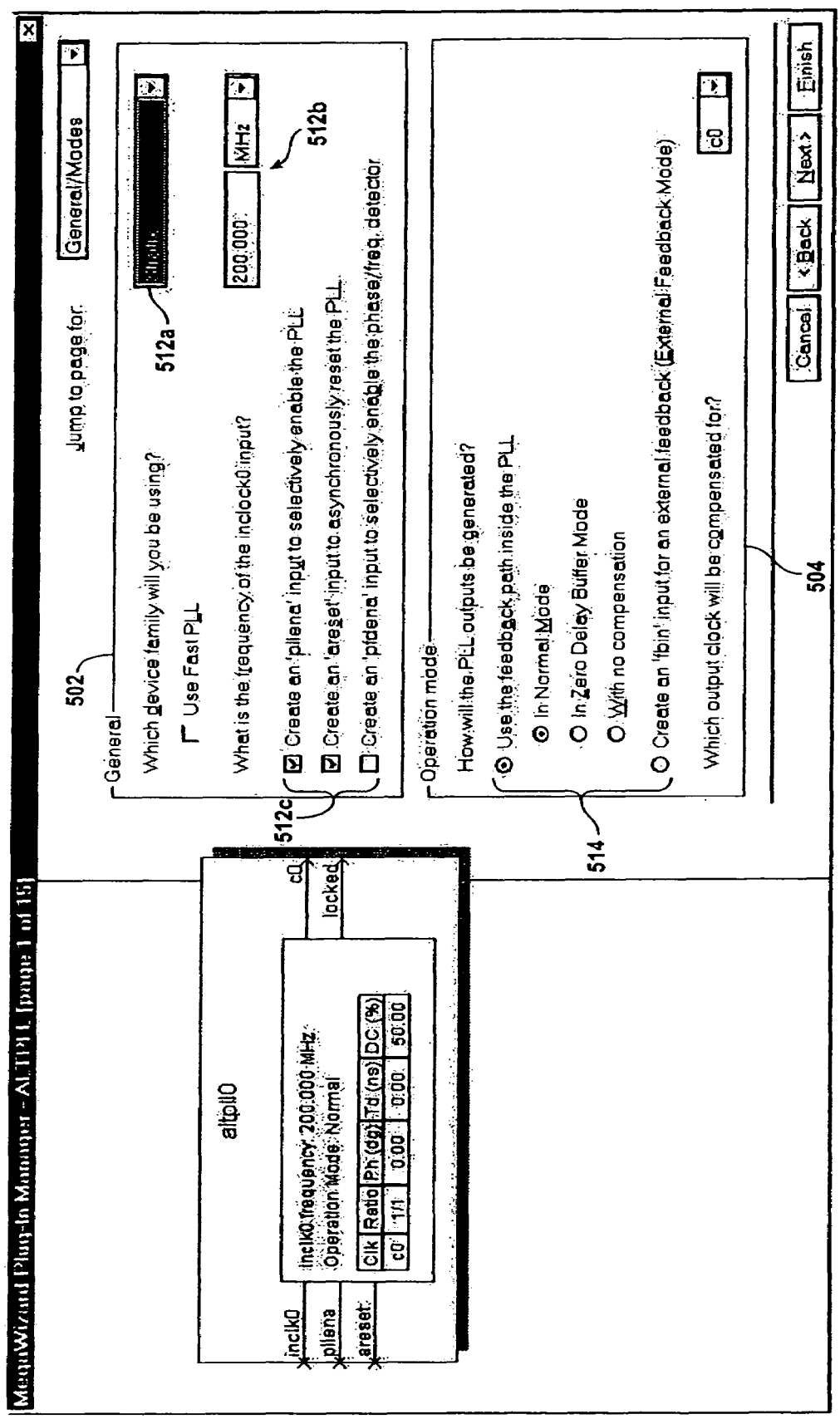
FIGS. 5A-5C illustrate graphical user interface exemplars for interacting with a user to obtain design information in accordance with an aspect of the present invention.
Figure 5B:
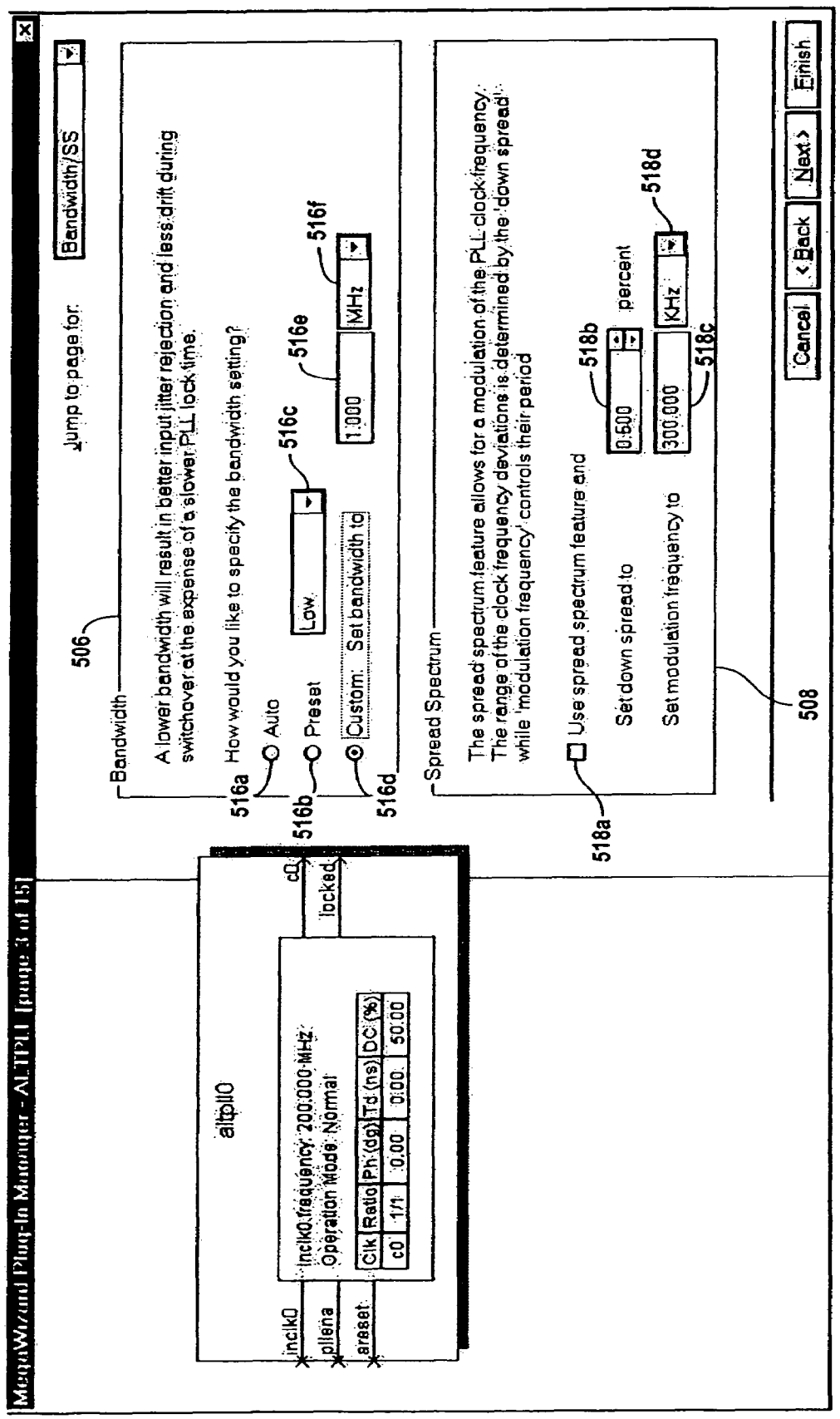
Figure 5C:
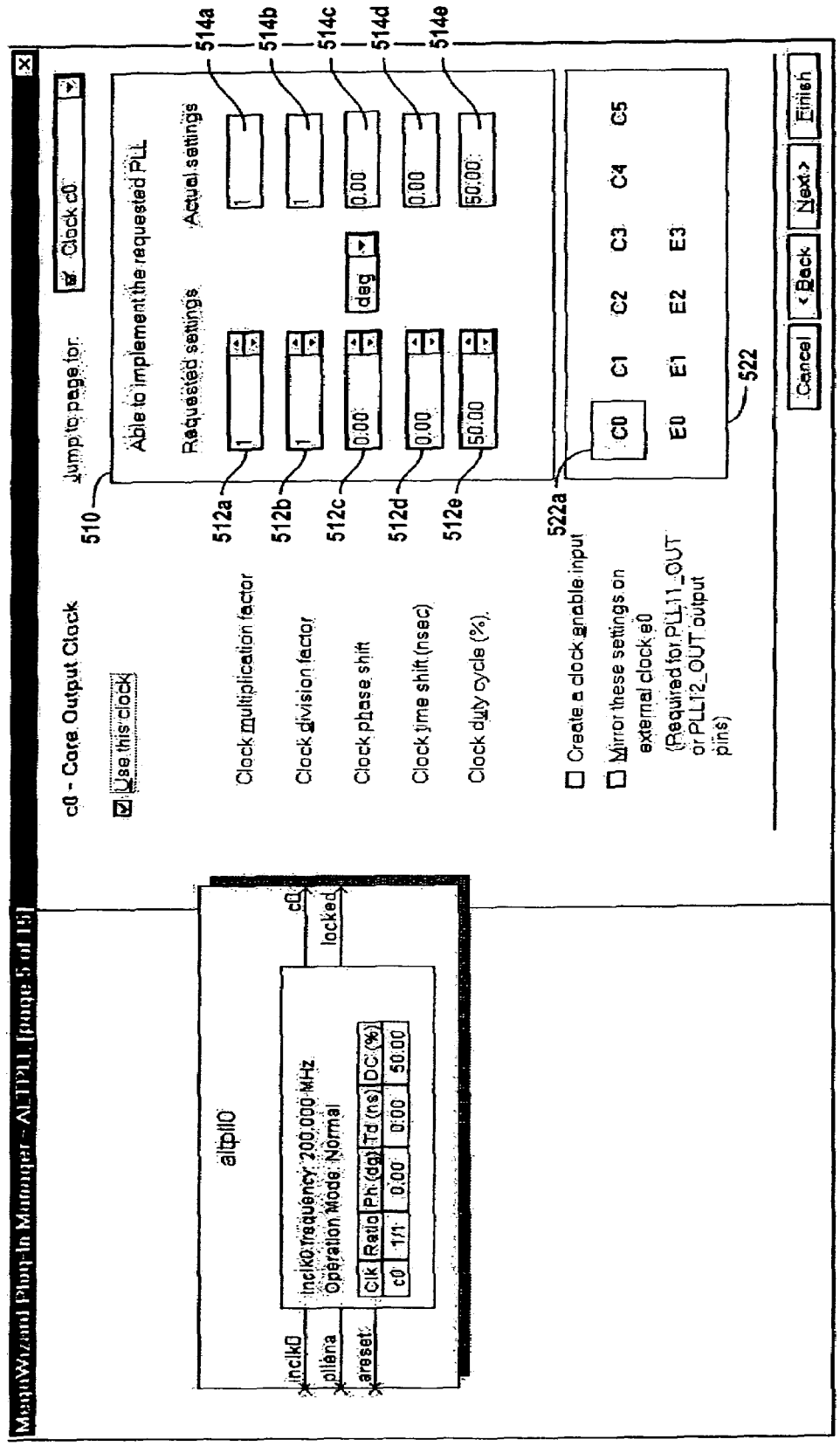

FIGS. 5A-5C are screenshots of an implementation of a GUI in accordance with the invention. The GUI can provide an interaction medium for a user during a design session to obtain design parameters which specify the properties of an analog circuit. The "look and feel" of the GUI is particular to the specific implementation. This illustrative GUI is presented here merely as an example and as a vehicle for explaining, in terms of a particular implementation, the broader aspects of the invention which will be readily apparent to those of ordinary skill in the relevant arts. The particular GUI shown in the figures are used with a programmable device known as the Stratix™ brand programmable device manufactured and sold by the Assignee of the present invention.

FIG. 5A shows an initial screenshot for obtaining general information about the design of the analog circuit, in this case a phase-locked loop (PLL). The information gathered by the interface illustrated in this screenshot is typical. For example, a graphic which presents a general information area 502 can be provided to allow the user to specify a particular device to be programmed. A pulldown menu graphic 512a can be provided to present a list of devices from which to choose. A data entry area 512b for specifying the input frequency to the PLL may comprise a data entry field for typing in a frequency and a pulldown menu to specify the frequency units, e.g., KHz, MHz, etc. IO pin definitions for the PLL can be specified. For example, a set of checkbox graphics 512c can be presented to the user, allowing her to pick which IO pins will be provided for the PLL.

A graphic which presents an operational mode area 504 can be presented. Radio button graphics can be presented to the user, allowing her to specify the mode by which the PLL outputs will be generated.

Conventional navigation buttons can be provided to facilitate the user's interaction. For example, button graphics 506 can permit a user to simply CANCEL this particular design session, to proceed to the NEXT step in the design session, to go BACK to a previous step, or to indicate that she has FINISHed the design.

FIG. 5B shows another screenshot illustrating how a user can specify parameters which define some properties of an analog circuit. In the case of a PLL, for example, a graphic which presents a bandwidth data entry area 506 can be provided. The user can specify the bandwidth via a number of modes. The user can specify the bandwidth in a qualitative manner. For example, the user can "click" on a radio button graphic 516a to specify the bandwidth "automatically." Clicking on this radio button signifies that the synthesis compiler functionality 410 will automatically determine an appropriate bandwidth parameter to satisfy the other PLL parameter settings. A second radio button 516b can be provided to allow the user to select the bandwidth using preset levels such as "High", "Medium", or "Low" quality levels. An associated pulldown menu 516c can be provided to display the preset choices, which can include additional levels, e.g., "Medium-High," "Medium-Low," "Very Low," and so on. Still a third radio button graphic 516d can be provided to allow the user specify a numeric value for bandwidth. Thus, a data entry field 516e can be provided, into which a numeric value is typed and a pulldown menu 516f can provide a selection of suitable units of frequency.

The spread spectrum frequency parameter can be set through a spread spectrum data entry area 508. A checkbox 518a allows the user to specify the spread spectrum parameters of a PLL. The figure shows the checkbox is unchecked, and so the corresponding data entry fields are grayed out. A first data entry field 518b is provided for specifying the "down spread" percentage. A second data entry area comprises a data entry field 518c and a pulldown menu 518d for specifying the modulation frequency. The data entry field 518c provides a data entry area, and the frequency units can be selected from the choices provided in the pulldown menu.

FIG. 5C shows a screenshot, illustrating how a user can specify the parameters for various clock signal outputs generated by the PLL. The figure illustrates a screenshot for setting the C0 clock signal. This is indicated by the clock selection graphic, identifying the various clock signals that can be set. Here, the icon 522a corresponding to the clock signal C0 is shown highlighted in an appropriate fashion to indicate which clock signal is being set.

A data input area 510 allows a user to specify various analog parameters for the specified clock signal. The user enters her desired settings in data entry fields 512a-512e. Actual settings are displayed in data display fields 514a-514e. In one implementation, the actual settings can be updated in real-time fashion as soon as the user enters a new setting.

It can be appreciated that additional analog parameters which specify other analog properties of the PLL can be set via the user interface functional unit 404 by providing appropriate data entry screens as exemplified by the screens shown in FIGS. 5A-5C. Additional parameters include lock time (ms), overshoot and undershoot frequencies (%), duty cycle, attenuation factor, input jitter tolerance, jitter transfer, and added jitter. As noted above, the user can enter these parameters directly in an extended HDL language (VHDL, Verilog®, AHDL).

A typical design of a PLL on the Stratix™ device is expressed in a Verilog® HDL specification. A fragment of the HDL specification showing a sample of netlist entries for the design follows:

```
wire locked = sub_wire3;
wire [5:0] sub_wire5 = {sub_wire6, sub_wire6,
    sub_wire6, sub_wire6, sub_wire4, sub_wire4};
wire sub_wire7 = inclk0;
wire [1:0] sub_wire8 = {sub_wire6, sub_wire7};
wire [3:0] sub_wire9 = {sub_wire6, sub_wire6,
    sub_wire6, sub_wire6};
altpll   altpll_component (
                .clkena (sub_wire5),
                .inclk (sub_wire8),
                .pllena (pllena),
                .extclkena (sub_wire9),
                .areset (areset),
                .clk (sub_wire0),
                .locked (sub_wire3));
defparam
    altpll_component.clk1_divide_by = 1,
    altpll_component.bandwidth = 1000000,
    altpll_component.bandwidth_type = "CUSTOM",
    altpll_component.clk1_phase_shift = "0",
    altpll_component.clk0_duty_cycle = 50,
    altpll_component.lpm_type = "altpll",
    altpll_component.clk0_multiply_by = 1,
```

The highlighted portion of the HDL fragment is an extension of the HDL definition in accordance with the invention. The HDL statement:

altpll_component.bandwidth=1000000 is an extension of the HDL language according to the present invention which specifies the bandwidth of the PLL (e.g., 1 MHz). This analog parameter is called out in terms of a property of the analog circuit itself, namely, its bandwidth, rather than in terms of the programmable analog elements that would implement the circuit. This obviates the user having to specify implementation specific detail in order to obtain a PLL circuit having a bandwidth of 1 MHz. The statement:

altpll_component.bandwidth_type="CUSTOM"

is an HDL extension which simply informs the synthesis compiler functional unit 410 that a specific value is being supplied for the bandwidth.

Consider the following modified HDL fragment:

```
wire locked = sub_wire3;
wire [5:0] sub_wire5 = {sub_wire6, sub_wire6,
    sub_wire6, sub_wire6, sub_wire4, sub_wire4};
wire sub_wire7 = inclk0;
wire [1:0] sub_wire8 = {sub_wire6, sub_wire7};
wire [3:0] sub_wire9 = {sub_wire6, sub_wire6,
    sub_wire6, sub_wire6};
altpll   altpll_component (
                .clkena (sub_wire5),
                .inclk (sub_wire8),
                .pllena (pllena),
                .extclkena (sub_wire9),
                .areset (areset),
                .clk (sub_wire0),
                .locked (sub_wire3));
defparam
    altpll_component.clk1_divide_by = 1,
    altpll_component.bandwidth_type = "AUTO",
    altpll_component.down_spread = "0.500",
    altpll_component.spread_frequency = 3333333,
    altpll_component.clk1_phase_shift = "0",
    altpll_component.clk0_duty_cycle = 50,
    altpll_component.lpm_type = "altpll",
    altpll_component.clk0_multiply_by = 1,
```

The highlighted portion illustrates further extensions to the HDL definition. Here, the modified segment specifies the analog parameters for a specific spread spectrum characteristic of the PLL. The HDL statement:

altpll_component.bandwidth_type="AUTO"

indicates that the bandwidth parameter has not been specified by the user and can be determined by the compiler instead, in order to optimize the other properties specified by the user; e.g., spread spectrum or phase offset.

The statement:

altpll_component.down_spread="0.500"

specifies the user requested down spread percentage. This extension of the HDL definition allows the user to specify the down spread parameter explicitly, rather than requiring the user to identify the hardware parameters of the various programmable elements and to specify the values (hardware properties) to implement is aspect of the PLL.

The statement:

altpll_component.spread_frequency=3333333 is another extension of the HDL definition in accordance with the invention that specifies the spread frequency, another analog parameter which specifies a property of the PLL.

It can be appreciated from the foregoing that the definition of any HDL language can be easily extended to include other primitives for specifying the properties of other types of analog circuits.

Figure 6:
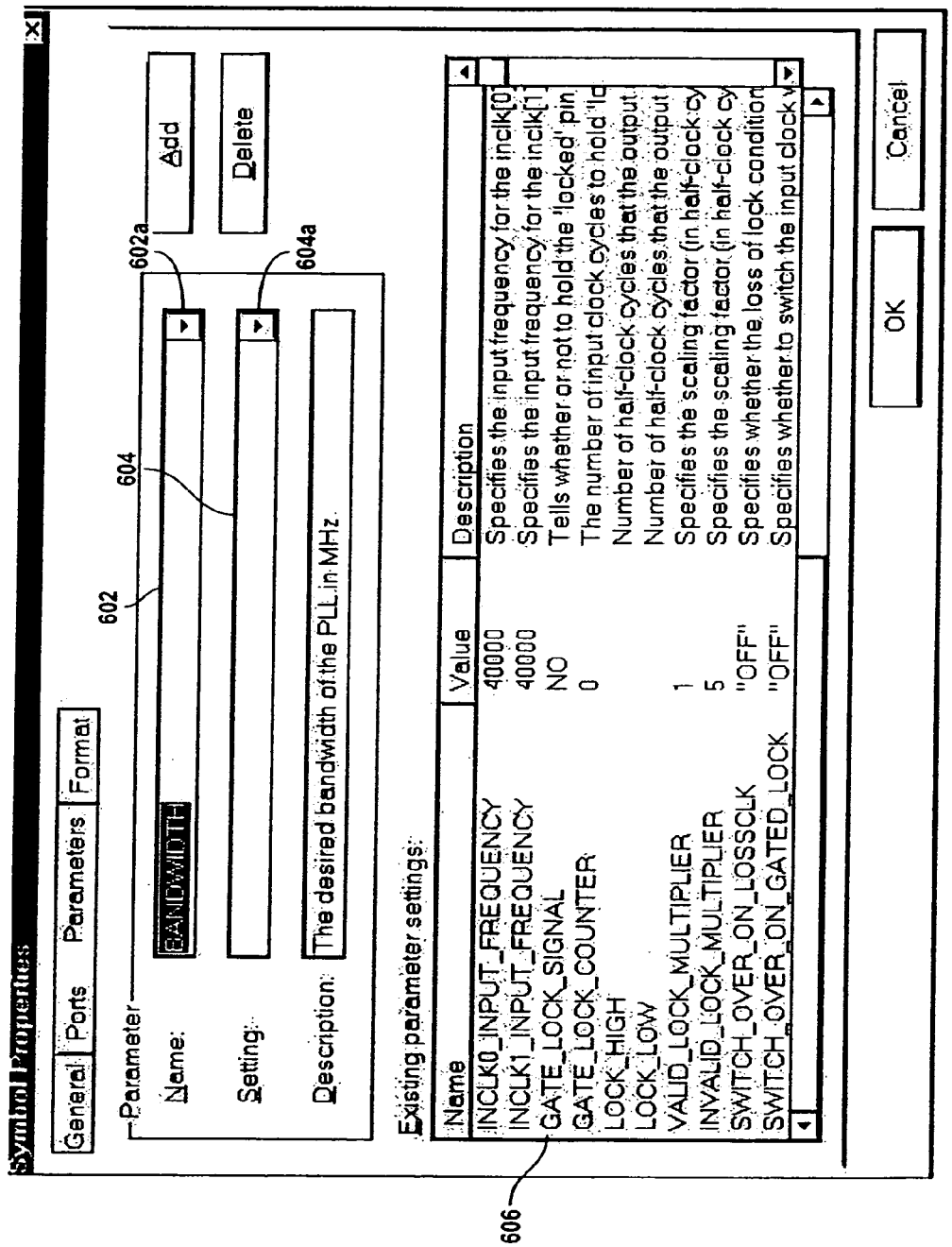
FIG. 6 illustrates an example of an alternative data entry GUI.

FIG. 6 shows an alternative data entry method that can allow a user to modify an existing design, or even to create a design. The graphic shown in FIG. 6 provides a data entry field 602 which allows a user to enter an analog parameter, or alternatively to select the parameter from a dropdown menu activated by clicking on the dropdown menu selector graphic 602a. The parameters provided in this data field include the hardware parameters for the programmable analog elements and analog parameters for specifying analog circuit properties, such as bandwidth. A second data entry field 604 allows the user to enter a specific setting for the selected parameter. In some cases, predefined values may be available. In some cases, the parameter can only be set to certain predefined values. In such cases, a dropdown menu selector graphic 604a can be provided to activate a dropdown menu showing the selectable settings. A window 606 can be provided which lists all of the parameters in the particular programmable device (e.g., Stratix™ device) that can be set. This window, which can be scrollable, offers the user another access path to the parameters. Thus, the user can simply double-click in the window on the parameter of interest. The window can provide information such as the current setting of each parameter.

Recall from FIG. 4 that the computational functional unit 408 computes all of the above hardware properties (values, settings) for programming the programmable analog elements. In the case of a PLL, the programmable analog element values for a given programmable device can include a charge pump current setting, a high frequency loop capacitor setting, a loop resistor setting, and a VCO gain setting. A user who is not familiar with the theory of PLL operation would be hard-pressed to identify the hardware parameters needed to implement a PLL (or any analog circuit) and to specify the hardware properties of those hardware parameters to achieve a desired behavior in the PLL. Worse yet, different devices are likely to provide different programmable analog elements with different settable hardware parameters. Thus, even if one is familiar with the implementation specifics of one programmable device, that knowledge may not carry over to other devices. By extending the HDL specification language in accordance with the invention to provide for language constructs which allow one to specify the analog properties of an analog circuit, intimate familiarity with the specific programmable device can be obviated. Providing an appropriate interface further facilitates the users ability to specify an analog circuit.

As noted above, the computational functional unit 408 performs the transformation of the various analog parameters which characterize the properties of an analog circuit to generate the hardware properties of the programmable analog elements. In accordance with an embodiment of this aspect of the invention, a transformation technique includes iteratively solving for circuit equations which describe the analog circuit in terms of the parameters of the programmable analog elements that are available for implementing the analog circuit. The solution is determined incrementally, resulting in a set of one or more hardware properties used to program the programmable analog elements to implement the analog circuit.

Figure 7:
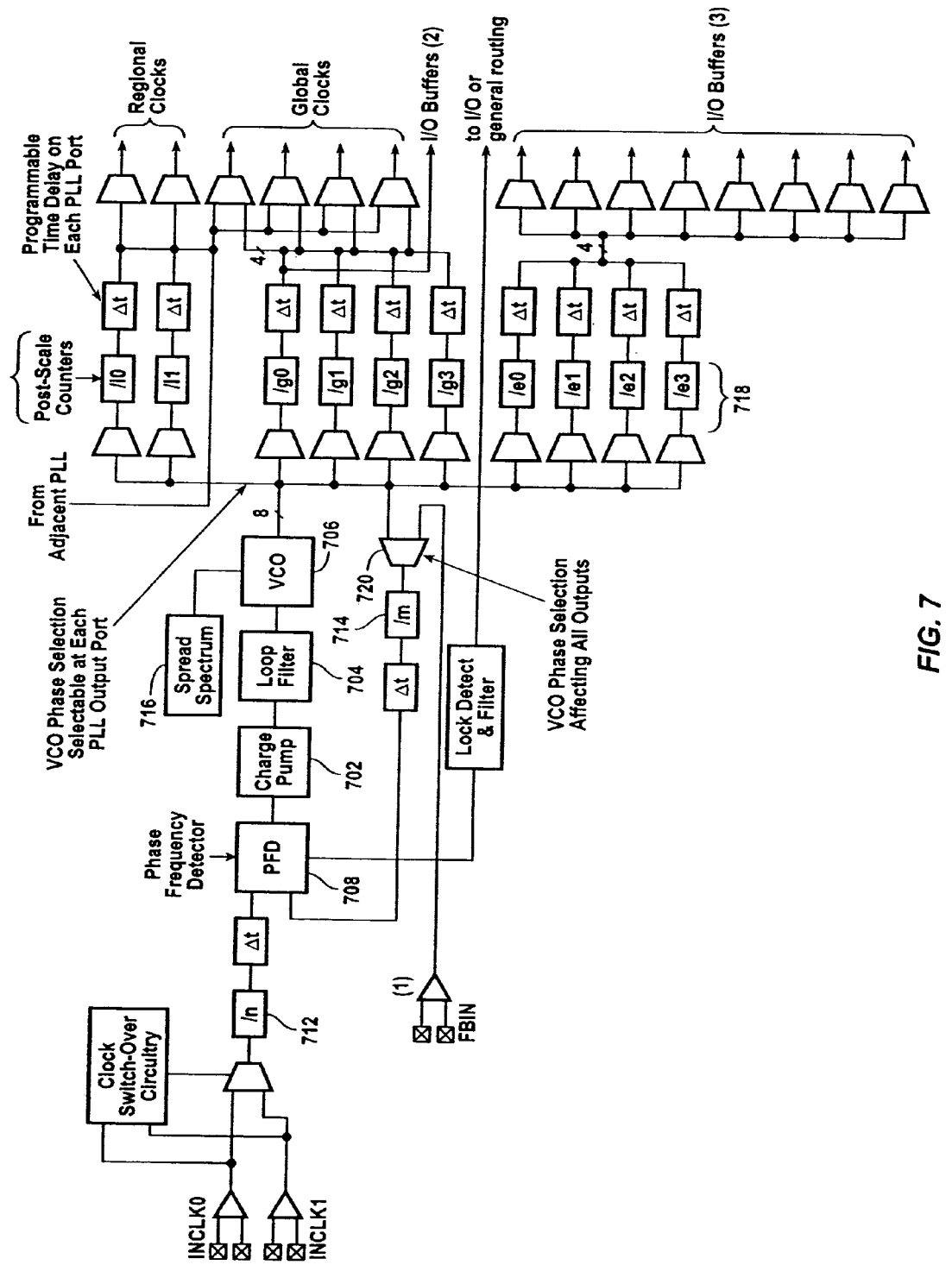
FIG. 7 shows a block diagram of an example of a programmable analog device.

An example for illustrating this aspect of the invention is a PLL that is implemented on the Stratix™ programmable device as shown in FIG. 7. The programmable analog elements include a charge pump circuit 702, a loop filter 704, and a voltage controlled oscillator (VCO) circuit 706. The charge pump circuit can be programmed in terms of its charge pump current setting. The loop filter has a high frequency loop capacitor that can be programmed. The loop filter also has a settable loop resistance value. The VCO gain setting is programmable.

The computations to produce the specific hardware properties can be performed by iterating over all possible values for the charge pump current, capacitors and resistor, as well as values for the various counters. The result will be a set of hardware properties that meet the hardware stability criteria which provide the necessary user-specified properties, and which optimize those default settings that were not user-specified. If more than one combination is legal, then the compiler can be configured to choose the best one to optimize a performance property; e.g., the jitter peaking. Since there can be millions of possible combinations of values, an optimization is usually needed.

Optimization methods are well understood techniques. The specific analytical treatment depends largely on the particular PLL implementation. The following optimization algorithm is illustrative of the general principles involved, as applied to the Stratix® programmable device shown in FIG. 7.

| | |
|---|---|
| Inputs: | vco and pfd min and max period and vco center period |
| | discrete set of values for I, R, and C |
| | These inputs are hardware limits which come from the design of the chip. For example, the design simulations produce a range of vco and pfd frequency at which the chip can work. |
| | The discrete set of values for I, R, and C are the values which can be programmed on chip. |
| | The algorithm will select one value each for I, R, and C among the possible values. |
| | For example, for Stratix, I can be 2 uA, 3 uA, 5 uA, . . . etc. to 200 uA - about 20 values; C can be 5, 10, 15, 20 pF. |
| User Inputs: | input period for the clock of the PLL pp.m_input_period |
| | Desired multiplication and division ratio for each output (i = 0, 9) |
| | This is input from the modified HDL specification. |
| | For example: altpll_component.inclk0_input_frequency = 10000, |
| | altpll_component.clk0_multiply_by = 1, |
| | altpll_component.clk0_divide_by = 1, |

The following are the division and multiplication values as specified by the user. They are copied from altpll_component.clk0_multiply_by and altpll_component.clk0_divide_by.

pp.m_taps[i].m_mult
pp.m_taps[i].m_div

Following are the user-specified properties of the PLL circuit:

Desired input period for the clock of the PLL pp.m_input_period
Desired multiplication and division ratios pp.m_taps[i].m_mult, pp.m_taps[i].m_div
Desired phase for each output pp.m_taps[i].m_phase
Desired duty cycle for each output pp.m_taps[i].m_duty_cycle
Desired spread spectrum pp.m_down_spread.
Desired modulation frequency pp.m_ss_period.
Desired bandwidth type pp.m_bandwidth_type - HIGH, MEDIUM, LOW, CUSTOM
Desired bandwidth value pp.m_bandwidth (If CUSTOM, then this is relevant)

-continued

```
Output:
Fully configured PLL.
M, N (in case of spread spectrum: M2, N2, SS)
R, C_h, I - resistor, capacitor, current settings for the loop parameters.
```

The algorithm computes the full configuration of the PLL, including the programmable hardware elements R, $C_h$, I which can satisfy stability criteria such as:

```
Fzero = 1 / (2 * Pi * R * C); Pi=3.14
Fpole = 1 / (2 * Pi * R * Ch);
Bandwidth = I *R * Kvco / (M * 2 * Pi); and
Fzero < Bandwidth < Fpole.
```

Referring to FIG. 7, M is the counter setting for the loop counter and N is the setting for the frequency pre-divider 712. In the case of a Spread Spectrum setting, the settings M2 and N2 are a second set of values for counters used in the spread spectrum module 716 (shown in detail in FIG. 7A). SS is the spread-spectrum counter. These parameters are determined below.

The R, C parameters specify the RC constant of the loop filter 704. The I parameter is in the charge pump current in the charge pump 702. FIG. 7B shows additional detail of the loop filter, showing the programmable elements that can be set. These parameters are determined below.

```
pll.m_taps[i].m_high, pll.m_taps[i].m_low
```

The "pll.m_taps" values are the high and low values, respectively, of the post-scale counters 718.

```
pll.m_taps[i].m_initial,
pll.m_taps[i].m_ph
```

The .m_ph refers to which VCO tap it feeds from, selector 720.

Algorithm

```
MAX_M_MULT = 4;
min_m = max_m + 1;
m_c is the Ch. from [6]
m_clow is C from [6]
for m = 1 to max_m
{ Begin M Loop
    if(m > min_m * MAX_M_MULT) exit loop, e.g. next m value
    ir = static_cast<int>(required_bandwidth_value * m / m_kvco) ;
    ir_ok = true;
    if (ir > ir_max || ir < ir_min)
    {
      ir_ok = false;
    }
    if(spread_required) m must be > 1/down_spread otherwise exit loop (e.g. next M value)
    /* now try all N values)
    for (n = 1; n <= max_n ; n++)
    { Begin N Loop
        double vco_period = pp.m_input_period * static_cast<double> (n) / m ;
            double pfd_period = pp.m_input_period * static_cast<double> (n) ;
        if ( not (
           m_vco_min_period > vco_period && vco_period <= m_vco_max_period &&
           m_pfd_min_period <= pfd_period && pfd_period <= m_pfd_max_period)
         )
        { exit N loop - next n value }
        // assume all taps same max count
        const int max_tap_count = this->m_taps[i].m_max_count;
        // output counter G = (m * div) / (n * mult) , since mult/div = M / (n*g)
        int a = m * pp.m_taps[i].m_div ;
        int b = n * pp.m_taps[i].m_mult;
        pll.m_taps[i].m_count = (double)a / b + 0.5; -- to find closest if not exact
        const int& count = pll.m_taps[i].m_count;
        // probably not needed.
        pll.m_taps[i].m_bypass = (1 == pll.m_taps[i].m_count);
        pll.m_taps[i].m_count = count;
        /* this sets a tentative duty cycle at 50% */
        pll.m_taps[i].m_high = pll.m_taps[i].m_count / 2;
        pll.m_taps[i].m_low = pll.m_taps[i].m_count − pll.m_taps[i].m_high ;
        pll.m_taps[i].m_even = pll.m_taps[i].m_count % 2 == 0;
        pll.m_taps[i].m_max_count = this->m_taps[i].m_max_count;
        // give it cost for not being exact, if achievable tap_cost will be 0.
        //int tap_cost = a % b ;
        // there is a variation to cost differently, based on closest output frequency, e.g.
        tap_cost = (double)(a) / b − (double)(div) / mult
        cost += tap_cost;
  /* set the best phase, e.g. determine initial values of counters and phase tabs - irrelevant for duty cycle or
        phase_cost = ...
  */
        cost += phase_cost.
        // cost variation
        cost += fabs(vco_period − vco_center)
```

-continued

| Algorithm |
| --- |

Keep track of the one with best cost and save it for later use.
```
        if (cost < best_cost)
        {
            cost = best_cost
            best_pll = pll;
        }
    } End loop N
} End loop M
```
/* now modify best pll for duty cycle*/
need to set separately the high and low counter values.
count = pll.m_taps[i].m_count
int half_count = count * 2;
```
    // round it with intentional cast - this is the best we can do.
    int half_high = static_cast<int> (pp.m_taps[i].m_duty_cycle * half_count / 100.0 + 0.5);
    int half_low = half_count − half_high;
    // PLL counters are in whole periods, but set the odd/even flag.
    // half_high and half_low are together both either even or odd.
    pll->m_taps[i].m_even = (half_high % 2 == 0);
    int high = half_high / 2 + ! pll->m_taps[i].m_even;
    int low = half_low / 2;
```
This computes the high low values and they can be set on the PLL to achieve
the desired duty cycle.
/* now modify best pll for bandwidth and spread spectrum */
HIGH bandwidth - set highest possible I (current)
Low bandwidth M = m * factor, N = n * factor, factor is chosen as the
biggest number such that pfd period (=input_period * N) is < m_pfd_max_period.
Now do a sweep over the possible values of I and R and keep the one that
gives lowest bandwidth, while still keeping fzero < bandwidth < fpole
```
for(unsigned i_index = 0; i_index < i_size && ! done; i_index++)
{
    int i_tent =m_impl->m_i_set[i_index];
    for(unsigned r_index = 0; r_index < r_size && ! done; r_index++)
    {
        int r_tent = m_impl->m_r_set[r_index];
        double bw    = (i_tent * r_tent * m_kvco / (m_m.m_1)/2 / PI) ;
        if (best_bw > bw)
        {
            int fzero = static_cast<int>(1E12 / (r_tent * m_c));
            double chigh_low = 1 / (1/m_c + 1/m_clow)
            double fpole = 1E12 / r_tent * chighlow ;
            if (fzero < bw && bw < f_pole)
            {
                best_bw = bw;
                m_charge_pump_current = i_tent;
                m_loop_filter_r = r_tent;
            }
        } // new potential best bw
    }
}
```
// CUSTOM bandwidth, for determination of the loop filter parameters as shown in Fig. 7B
// set i r c
// set ir.
// bandwidth in Hz, kvco in Mhz/V - cancels units. ir in uA * R
int ir = static_cast<int>(required_bandwidth_value * m_m.m_1 * 2 * PI / m_kvco) ;
```
    // favor smallest r
    bool done = false;
    double best_cost = WORST_COST;
    for(unsigned r_index = 0; r_index < r_size && ! done; r_index++)
    {
        for(unsigned i_index = 0; i_index < i_size && ! done; i_index++)
        {
            int i_tent = m_impl->m_i_set[i_index];
            int r_tent = m_impl->m_r_set[r_index];
            int ir_tent = i_tent * r_tent;
            double bw_tent = static_cast<int>(ir_tent * m_kvco / m_m.m_1) / 2 / PI;
            Basic optimization cost - how close is the tentative I*R to the desired I*R?
            double cost = fabs(ir_tent / ir − 1)
            // Other optimization costs are possible,in addition for example,
            // Example cost - discourage high R to prevent peaking
            cost += 0.01 * (r_tent / r_min) ;
            // Other possible costs. Actual cost could be combination of
            / a few of those with weighting factors
            // Target bw to be in the middle of zero and pole in log scale, or
            // another combination of zero and pole as shown by simulations, e.g.
            cost += fabs(bw * bw − fzero * fpole)
            // target paricular I or R
            cost += fabs(i_tent − i_target);
            double f_zero = 1E12 /(r_tent * m_c);
```

-continued

Algorithm

Figure 7A:
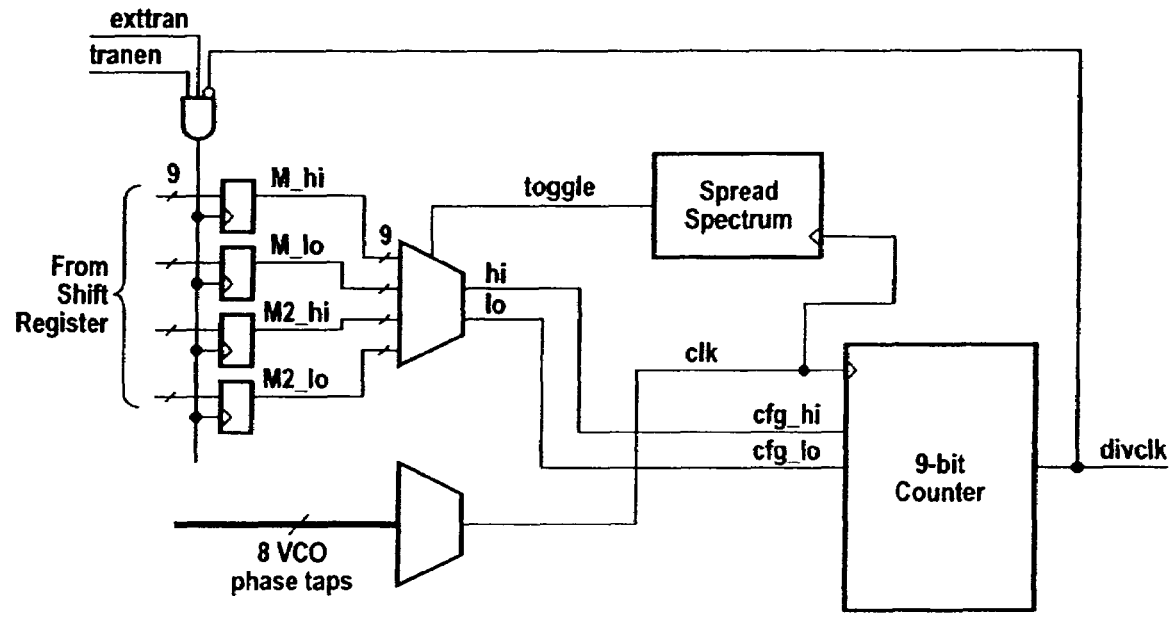
FIG. 7A shows additional detail for the spread spectrum element shown in FIG. 7.
Figure 7B:
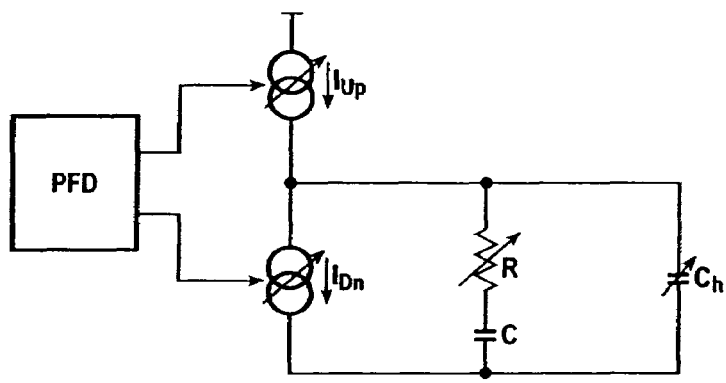
FIG. 7B shows additional detail for the loop filter of FIG. 7.

```
            double chigh_low = 1 / (1/m_c + 1/m_clow)
            double fpole = 1E12 / r_tent * chighlow ;
            if(cost < best_cost && f_zero < bw_tent && bw_tent < f_pole)
            {
                best_cost = cost;
                this->m_charge_pump_current = i_tent;
                this->m_loop_filter_r = r_tent;
            }
        }
    }
}
//      assert(done);
// End CUSTOM bandwidth
// now set spread spectrum if needed
// (for determination of the spread spectrum parameters in the module as shown in Fig. 7A
int offset = static_cast<int>(static_cast<double> (m_m.m_1 * pp.m_down_spread) + 0.5);
        m_m.m_2 = m_m.m_1 - offset;
        m_n.m_2 = m_n.m_1 ;
        m_ss = pp.m_ss_period / pp.m_input_period;
        if (m_ss > m_ss_max_counter) m_ss = m_ss_max_counter;
/* The three values m_2, n_2 and ss are what we are computing for spread spectrum. */
```

An aspect of the invention includes computing cost criteria which control the optimization path for computing some of the hardware properties. For example, in the bandwidth computation, the determination of the loop filter resistor R can be influenced by a cost criterion to limit its allowable maximum value. A motivation for doing this could be to prevent jitter peaking. This is shown in the algorithm above where cost+=0.01*($r\_tent/r\_min$), where 0.01 is a weight factor This cost increases if r_tent, which is the tentative R, increases above the minimum possible R.

It can be appreciated by those of skill in the relevant arts that other cost criteria can be used to target other hardware parameters in a similar manner. The algorithm above merely illustrates this and other aspects of the invention. Other cost criteria can be readily formulated and plugged into the algorithm to achieve optimizations of other targets depending on the particulars of a specific PLL implementation. For example, it may be desirable to optimize M to be close to the startup frequency to minimize startup/lock time. This is done in the following code:

Cost+=fabs(vco_period−vco_center).

Other possible optimizations due to simulations is to minimize N. More generally, such optimizations can be readily adapted for hardware parameters to instantiate other analog circuits.

Figure 8:
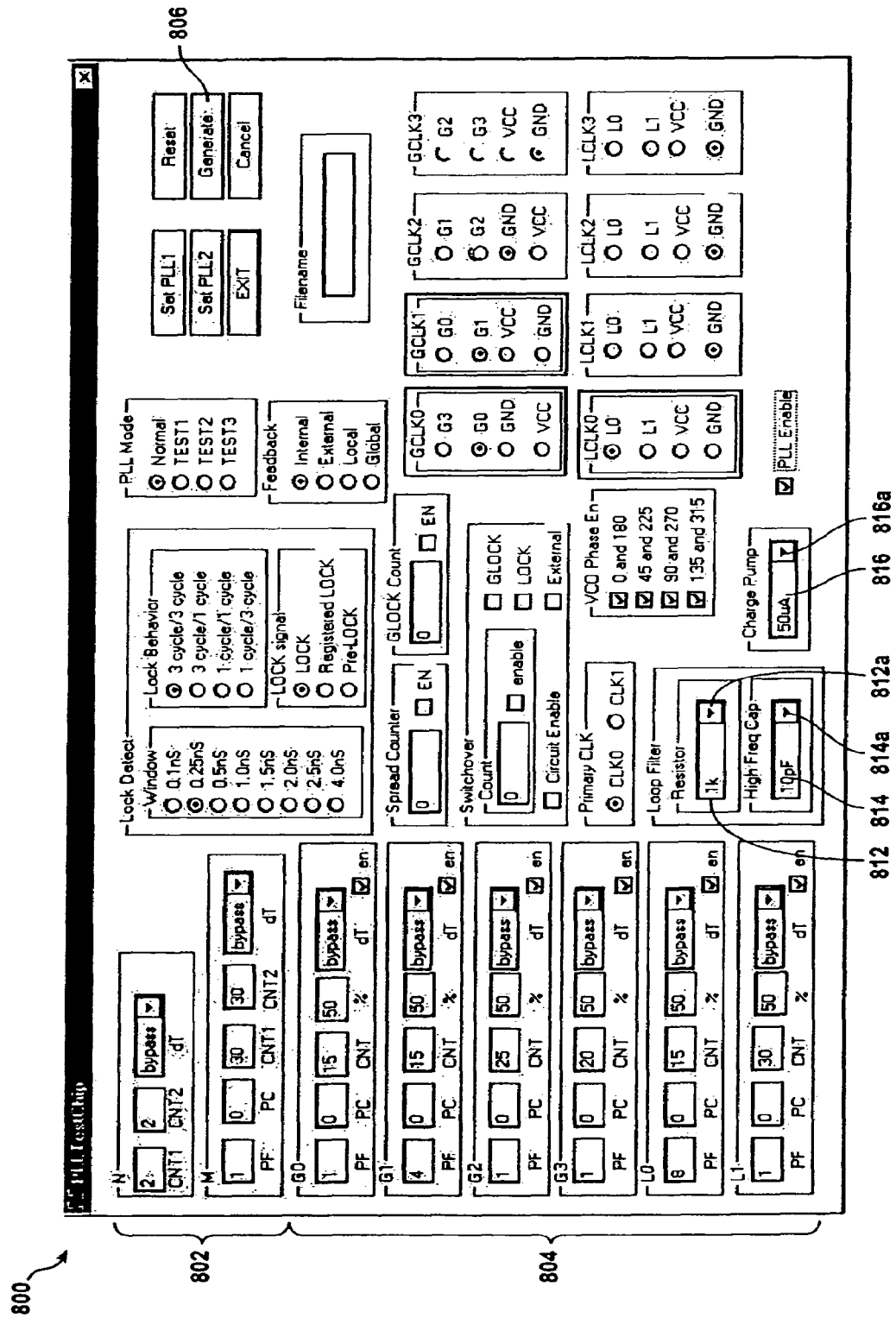
FIG. 8 shows an interface to facilitate "what if" inquiries.

FIG. 8 shows an implementation of a GUI in accordance with another aspect of the present invention which provides for exercising so-called "what-if" design scenarios, and to facilitate verification. The "what if" interface exemplar 800 shown in the figure allows a user to specify the analog parameters for the circuit shown in FIG. 7. This interface can be used in the following scenarios:

The user enters observable analog properties in a suitable fashion, for example, via the GUI shown in FIG. 5A. Suppose the user enters a bandwidth parameter of 1000 Hz for an analog circuit. The computation engine 408 then computes values for the programmable analog elements (e.g., based on the algorithm outlined above) to implement an instance of the analog circuit having a bandwidth of 1000 Hz. The computed hardware properties can then be displayed or otherwise represented in a suitable form, such as in the GUI exemplar shown in FIG. 8.

Next, the user can edit the values of one or more of the hardware parameters via the GUI of FIG. 8. For example, suppose one of the programmable analog elements is a loop resistor, and that the computed loop resistance is 1 KΩ. The user can modify this value and perform a "reverse computation" to produce predicted observable analog properties (in this case bandwidth) based on the modified loop resistance. The user can be presented with the display shown in FIG. 5A, for example, to see the effects of her modifications. In an embodiment of this aspect of the invention, the computation engine 408 can perform a "reverse computation" by applying conventional circuit modeling algorithms or other similarly known analytical tools for modeling circuits to compute analog parameters based on the user-modified values. This aspect of the invention allows the designer to hand tweak or otherwise fine-tune her design.

One aspect of the invention is to find the closest possible values for the desired analog properties. Given that the programmable analog elements can only be set to one of a finite set of discrete values, not all analog property values can be achieved. This algorithm finds the closest possible "discrete" values; e.g., 10 pf, 15 pf, 20 pf, etc., as compared to 10.134 pf or 11.33 pf. The what-if scenarios are very important in this case, so the user can fine tune the achieved values by adjusting values of other programmable analog elements in an attempt to compensate for the fact that the programmable analog elements can only take on discrete values.

Alternatively, the user may choose not to edit any of the computed hardware properties. Instead, the user can feed the computed values back to the computation engine and simply perform a "reverse computation" on the computed values to produce predicted analog properties. The predicted values can then be displayed, for example, via GUIs such as those shown in FIGS. 5A-5C. As an observation, the predicted analog properties should closely match the initial user-specified analog parameters. However, the "forward" computation whereby hardware properties are computed based on analog properties may be based on analog models that are different from the models used by the "reverse" computation whereby analog properties are computed from hardware properties. This aspect of the invention, therefore, allows a designer to prove (and possibly fine-tune) her design, at least on a theoretical level, before committing it to hardware.

FIG. 8 shows a particular implementation of this aspect of the invention. An input field 802 for receiving from a user counter modulo values for the counters 712 and 714. Similar input fields 804 are provided for receiving from a user parameters for setting the post-scale counters 718. By the use of these input fields, "experiments" can be performed on the digital aspects of the design.

In accordance with this aspect of the invention, similar "what if" experimentation can be performed on the hardware parameters for which were computed based on the user-specified analog parameters of an analog circuit contained in the design. Data fields for the hardware parameters can be provided to display a representation of their computed hardware properties and to receive new values from a user. Thus, for example, the loop resistor can be adjusted via a data field 812. This data field can initially display the value computed by the computation engine 408. The data field is writable and can accept a user-entered value. Alternatively, a drop down menu can be provided to provide the user with a choice of alternative resistance values. For example, all possible values that can be programmed on the hardware for the programmable analog element (e.g., resistor) can be provided. A drop down menu indicator 812a can be provided to activate this menu.

A high frequency capacitor component of the loop filter can be adjusted. An data field 814 can display the value computed by the computation engine 408. This data field can accept a user-supplied capacitance value. Alternatively, a drop down menu can be activated via an activation button 814a. The drop down menu can provide a set of capacitance values.

A computed charge pump value can be displayed in the data field 816. As with the other data fields, this data field can accept a user-provided datum. A drop down menu, activated by the button 816a, can provide all of the possible values for the programmable analog charge pump current.

A GENERATE button 806 can be provided to initiate a round of computations when the desired hardware properties for a "what if" experiment have been entered. The computation engine then calculate the observable properties, e.g. bandwidth, lock-time, etc. The observable properties will then reflect any changes to the digital parameters that the user might have inputted in the 802 and 804 data fields and any changes made to the hardware parameters that the user might have specified in the 812-816 data fields. For example, the designer can be taken back to one of the parameter input screens (FIGS. 5A-5C, for example) to review the results of her "experiment." In one scenario, the designer can then modify one or more analog properties and perform a "forward" computation to compute new values. She can return to the "what if" interface 800, and repeat the whole exercise.

The foregoing detailed description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This detailed description will enable others skilled in the art to best utilize and practice the invention in various embodiments and with various modifications as are suited to the particular use contemplated. It is intended that the scope of the invention be defined by the following claims.

What is claimed is:

1. A method of generating a configuration bitstream for use in configuring a programmable integrated circuit having programmable logic elements and programmable analog elements, the method comprising:

with a computer:

providing a user interface to receive first information describing one or more logic functions and second information representative of one or more analog properties specifying one or more observable characteristics of one or more analog circuits;

receiving the first and second information via the user interface;

computing hardware properties specifying one or more programmable settings used to set values for at least some of the programmable analog elements using the received second information;

generating a high-level-description netlist using the received first information and the computed hardware properties; and compiling the high-level-description netlist to generate the configuration bitstream.

2. The method of claim 1 wherein the user interface is a graphical user interface.

3. The method of claim 1 wherein the high-level-description netlist is in a hardware description language format.

4. The method of claim 1 wherein the hardware properties for at least one programmable analog element is used to set a value for the programmable analog element to one of a number of discrete values.

5. The method of claim 1 wherein the one or more logic functions are implemented using the plurality of programmable logic elements.

6. The method of claim 1 wherein the programmable integrated circuit is a programmable logic device.

7. A method of generating a configuration bitstream for use in configuring an integrated circuit comprising:

using a computer for:

providing a user interface to receive information representative of a plurality of analog properties specifying one or more characteristics for one or more analog circuits;

receiving information representative of a plurality of analog properties specifying one or more characteristics for one or more analog circuits;

computing hardware properties specifying one or more programmable settings used to set values for a plurality of programmable analog elements using the plurality of analog properties;

generating a netlist using the computed hardware properties; and compiling the netlist to generate the configuration bitstream.

8. The method of claim 7 wherein the one or more analog properties are received via a user interface.

9. The method of claim 7 wherein the one or more analog properties are received via a graphical user interface.

10. The method of claim 7 wherein the netlist is a high-level-description netlist.

11. The method of claim 10 wherein the high-level-description netlist is in a hardware description language format.

12. The method of claim 7 wherein the hardware properties for at least one programmable analog element is used to set a value for the programmable analog element to one of a number of discrete values.

13. The method of claim 7 wherein the hardware properties for at least one programmable analog element is used to set a value for the programmable analog element.

14. The method of claim 7 wherein the integrated circuit is a programmable logic device.

15. A method of generating a configuration bitstream comprising:
with a computer:
providing a user interface;
receiving analog properties specifying one or more characteristics for an analog circuit via the user interface;
generating hardware properties specifying one or more programmable settings used to set values for programmable analog elements in the analog circuit using the analog properties;
displaying the hardware properties using the user interface;
receiving modified hardware properties specifying one or more programmable settings used to set values for programmable analog elements in the analog circuit via the user interface;
generating modified analog properties specifying one or more characteristics for the analog circuit using the modified hardware properties; and
displaying the modified analog properties using the user interface.

16. The method of claim 15 further comprising:
generating a high-level-description netlist using the modified hardware properties.

17. The method of claim 16 further comprising:
generating the configuration bitstream using the high-level-description netlist.

18. The method of claim 15 wherein the user interface is a graphical user interface.

19. The method of claim 15 wherein the modified hardware properties are selected from among a discrete number of hardware properties.

20. The method of claim 15 wherein the configuration bitstream is useful in configuring a programmable logic device.

* * * * *

UNITED STATES PATENT AND TRADEMARK OFFICE
CERTIFICATE OF CORRECTION

PATENT NO.        : 7,634,752 B2                                         Page 1 of 1
APPLICATION NO.   : 11/592734
DATED             : December 15, 2009
INVENTOR(S)       : Mihail Iotov et al.

It is certified that error appears in the above-identified patent and that said Letters Patent is hereby corrected as shown below:

On the title page item (75),

Delete "Mikhail"
    and replace it with --Mihail--

Signed and Sealed this

Twenty-third Day of February, 2010

David J. Kappos
*Director of the United States Patent and Trademark Office*